United States Patent
Yang et al.

(10) Patent No.: US 7,871,935 B2
(45) Date of Patent: Jan. 18, 2011

(54) NON-PLASMA CAPPING LAYER FOR INTERCONNECT APPLICATIONS

(75) Inventors: Chih-Chao Yang, Glenmont, NY (US); Conal E. Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 12/108,119

(22) Filed: Apr. 23, 2008

(65) Prior Publication Data

US 2009/0269929 A1 Oct. 29, 2009

(51) Int. Cl.
*H01L 21/302* (2006.01)
*H01L 21/461* (2006.01)

(52) U.S. Cl. .............................. 438/710; 257/E21.224; 257/E21.575; 438/675; 438/687

(58) Field of Classification Search .......... 257/E21.224, 257/E21.575; 438/675, 687, 710
See application file for complete search history.

(56) References Cited

U.S. PATENT DOCUMENTS

| | | | |
|---|---|---|---|
| 5,009,714 | A | 4/1991 | Arrington et al. |
| 5,098,860 | A | 3/1992 | Chakravorty et al. |
| 5,930,669 | A | 7/1999 | Uzoh |
| 5,933,753 | A | 8/1999 | Simon et al. |
| 6,383,920 | B1 | 5/2002 | Wang et al. |
| 6,429,519 | B1 | 8/2002 | Uzoh |
| 6,555,916 | B2 | 4/2003 | Nguyen et al. |
| 7,288,205 | B2 * | 10/2007 | Lakshmanan et al. ......... 216/67 |
| 2007/0037388 | A1 * | 2/2007 | Hohage et al. .............. 438/675 |

FOREIGN PATENT DOCUMENTS

| | | |
|---|---|---|
| CA | 1244328 | 11/1988 |
| CA | 2023943 | 5/1999 |

OTHER PUBLICATIONS

Hymes, S. et al., "Surface cleaning of copper by thermal and plasma treatment in reducing and inert ambients," J. Vac. Sci. Tech. B 16, 1107, 1998.
Raghavan, G. et al., "Diffusion of copper through dielectric films under bias temperature stress," Thin Solid Films, 262, 1995.
Noguchi, J., et al., "Impact of Low-k Dielectrics and Barrier Metals on TDDB Lifetime of Cu Interconnects," Proceedings of IRPS, 2003, 287.
Noguchi, J., et al., "Cu-Ion-Migration Phenomena and its Influence on TDDB Lifetime in Cu Metallization," Proceedings of IRPS, 2003 287.

* cited by examiner

*Primary Examiner*—Asok K Sarkar
(74) *Attorney, Agent, or Firm*—Scully, Scott, Murphy & Presser, P.C.; Louis J. Percello, Esq.

(57) ABSTRACT

The present invention provides an interconnect structure which has a high leakage resistance and substantially no metallic residues and no physical damage present at an interface between the interconnect dielectric and an overlying dielectric capping layer. The interconnect structure of the invention also has an interface between each conductive feature and the overlying dielectric capping layer that is substantially defect-free. The interconnect structure of the invention includes a non-plasma deposited dielectric capping layer which is formed utilizing a process including a thermal and chemical-only pretreatment step that removes surface oxide from atop each of the conductive features as well as metallic residues from atop the interconnect dielectric material. Following this pretreatment step, the dielectric capping layer is deposited.

13 Claims, 3 Drawing Sheets

NON-PLASMA CAPPING LAYER FOR INTERCONNECT APPLICATIONS

FIELD OF THE INVENTION

The present invention relates to a semiconductor structure, and a method of fabricating the same. More particularly, the present invention relates to a semiconductor interconnect structure having a high leakage resistance as well as substantially no metallic residues (e.g., defects) present at the upper surface of the interconnect dielectric. The present invention also provides a method in which the leakage resistance within an interconnect structure is improved, while substantially eliminating the presence of metallic residues at the upper surface of the interconnect dielectric.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, or a Cu alloy since Cu-based interconnects provide higher speed signal transmission between large numbers of transistors on a complex semiconductor chip as compared with aluminum, Al,-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In current semiconductor interconnect structures, time-dependent-dielectric-breakdown (TDDB) has been identified as one of the major reliability concerns for future interconnect structures that include Cu-based metallurgy and low k dielectric materials. By "TDDB" it is meant, that overtime the dielectric material of the interconnect structure (i.e., the interconnect dielectric) begins to fail. The failure of the interconnect dielectric material may be caused by intrinsic means or by defects that are formed on the surface of the interconnect dielectric material during the course of preparing the interconnect structure.

Leakage of metallic ions, particularly Cu ions, along the interconnect dielectric surface has been identified as the major intrinsic failure mechanism that attributes to TDDB. FIG. 1A is a prior art interconnect structure 10 which illustrates this intrinsic leakage phenomenon. Specifically, the prior art interconnect structure includes a dielectric material 12 having a Cu feature 14 embedded therein. The Cu feature 14 is typically separated from the dielectric material 12 by a diffusion barrier 16. A dielectric capping layer 18 is present on the surface of the dielectric material 12, the diffusion barrier 16 and the Cu feature 14. In FIG. 1A, the arrows designate the leakage (diffusion) of Cu ions from the conductive feature 14 which occurs along the upper surface of the interconnect structure as shown. Overtime, this leakage of Cu ions results in TDDB as well as failure of the devices within the interconnect structure.

Another contributor to TDDB, which is illustrated in FIG. 1B, is defect related. Specifically, FIG. 1B is another prior art interconnect structure 10' including the components as shown in FIG. 1A in which Cu residues (e.g., defects) 20 are present at the interface between the upper surface of the dielectric material 12 and the dielectric capping layer 18. The Cu residues 20 are formed during the formation of the Cu features 14 (i.e., deposition and planarization of Cu within an opening formed into the dielectric material 12). Post planarization Cu residues, which provide defects at the surface of the dielectric material, are one of the root causes of time-dependent-dielectric-breakdown (TDDB) failure.

It is noted that although Cu is specifically mentioned with respect to the prior art interconnect structures mentioned above, the above leakage and defect problems occur (although at different rates and extents) with other types of conductive metals such as, for example Al and W.

It is further noted that in each of the prior art structures mentioned above, a dielectric capping layer 18 is formed upon the interconnect level including at least the dielectric material 12 and the Cu feature 14. Typically, the dielectric capping layer 18 is formed by first subjecting the exposed surface of the interconnect level including the dielectric material 12 and the Cu feature 14 to a preclean step. In current interconnect processing, such a preclean includes a $NH_3$ plasma treatment. Following the preclean step, the dielectric capping layer 18 is then deposited. It is observed that the plasma preclean and the deposition typically occur in-situ within the same processing tool.

Leakage measurements have shown that no degradation from leakage current occurs after deposition of the dielectric capping layer 18. Although no degradation from leakage current was observed after deposition of the dielectric capping layer, leakage measurements performed after the plasma preclean step, but prior to dielectric capping layer deposition, show that leakage is occurring. While not entirely known, this degradation, which occurs after the $NH_3$ plasma pretreatment, but prior to deposition of the dielectric capping layer, may be a TDDB related issue.

In view of the leakage problem illustrated in FIG. 1A, and the residues problem illustrated in FIG. 1B, there is a continued need for providing an interconnect structure in which metallic leakage, particularly, Cu ion diffusion, and metallic residues, particularly Cu residues, can both be reduced or completely eliminated from an interconnect structure.

SUMMARY OF THE INVENTION

The present invention provides an interconnect structure which has a high leakage resistance and substantially no metallic residues present at an interface between the interconnect dielectric and an overlying dielectric capping layer. The interconnect structure of the invention also has an interface between each conductive feature and the overlying dielectric capping layer (and between the dielectric capping layer and the dielectric material) that is substantially defect-free. By "substantially defect-free" it is meant that no metallic residues/particles and no physical damage on, or embedded in, the dielectric surface between any two adjacent interconnects are observed.

The interconnect structure of the invention includes a non-plasma deposited dielectric capping layer which is formed utilizing a process including a thermal and chemical-only pretreatment step that removes surface oxide from atop each of the conductive features as well as metallic residues from atop the interconnect dielectric material prior to the deposition of the dielectric capping layer. Following this pretreatment step, the dielectric capping layer is deposited.

The interconnect structure of the present invention has better reliability and technology extendibility for the semiconductor industry as compared to prior art interconnect structures in which the dielectric capping layer is formed utilizing a plasma pretreatment step which precedes the deposition of the dielectric capping layer.

In one aspect of the invention, a method of fabricating an interconnect structure having a dielectric capping layer that is not formed utilizing a plasma pretreatment step is provided. In general terms, the method of the invention includes steps of:

providing a structure including a dielectric material having a plurality of conductive features embedded therein, each of said conductive features includes a surface oxide layer, and said dielectric material having an upper surface that contains metallic residues thereon;

subjecting said structure to a thermal and chemical-only pretreatment step which removes said surface oxide layer and said metallic residues from said structure; and forming a dielectric capping layer on a bare upper surface of each of said plurality of conductive features and on a bare upper surface of said dielectric material.

In the inventive method, the term "thermal and chemical-only pretreatment" is used to denote a step in which the surface oxide layer and the metallic residues are removed from atop each of the conductive features and the dielectric material, respectively, by heating the structure in a reducing ambient (chemical gas or vapor), without the presence or generation of any plasma; no physical pretreatment such as a plasma pretreatment is used.

In one embodiment of the present invention, the reducing ambient includes, a $H_2$-containing atmosphere, a $NH_3$-containing atmosphere, a $N_2$-containing atmosphere, a $NF_3$-containing atmosphere and mixtures thereof. In a preferred embodiment, the reducing ambient is a $NH_3$-containing atmosphere.

The thermal and chemical-only pretreatment of the present invention is performed at an elevated temperature that is typically within a range from about 100° to about 500° C., with a temperature from about 150° to about 450° C. being even more typical. The duration of the thermal and chemical-only pretreatment may vary depending on the type of conductive material present within the surface oxide and metallic residues. Typically, the duration of the thermal and chemical-only pretreatment is from about 1 to about 20 minutes, with a duration from about 2 to about 5 minutes being even more typical.

In addition to the method described above, the present invention also provides an interconnect structure that is fabricated utilizing the processing steps of the present invention. Specifically, the present invention provides an interconnect structure that comprises:

a dielectric material having a plurality of conductive features embedded therein, each of said plurality of conductive features has an upper surface that is devoid of a surface oxide, and said dielectric material having an upper surface that is devoid of metallic residues; and a dielectric capping layer located atop each of said conductive features and said dielectric material, wherein said dielectric capping layer has an interface with each of said plurality of conductive features that is substantially defect-free.

It is also observed that the surface of the dielectric material is free of physical damage.

BRIEF DESCRIPTION OF THE DRAWINGS

FIG. 1A shows Cu leakage, while FIG. 1B shows Cu residues; both of which cause TDDB.

DETAILED DESCRIPTION OF THE INVENTION

The present invention, which provides an interconnect structure having high leakage resistance and no metallic residues present at the surface of an interconnect dielectric material and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure having high leakage resistance and substantially no metallic residues present at the surface of the dielectric material (e.g., the inventive interconnect structure includes a substantially defect-free conductive feature/dielectric capping layer interface as well as a substantially defect-free dielectric material/dielectric capping layer interface) and a method of fabricating the same. The inventive interconnect structure exhibits improved TDDB than prior art invention structures. Moreover, the dielectric material of the inventive interconnect structure has an upper surface that is free of physical damage.

Figure 1A:
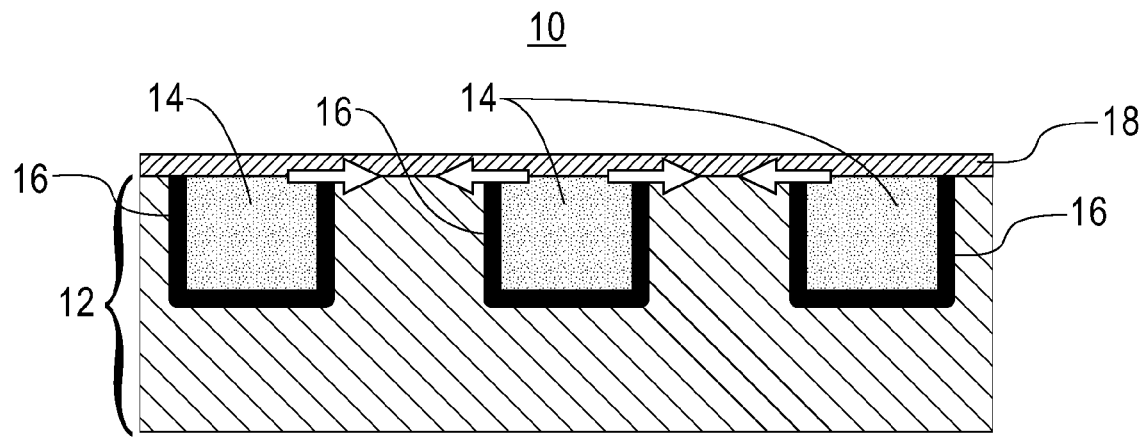
FIGS. 1A-1B are pictorial representations (through cross sectional views) depicting prior art interconnect structures.
Figure 1B:
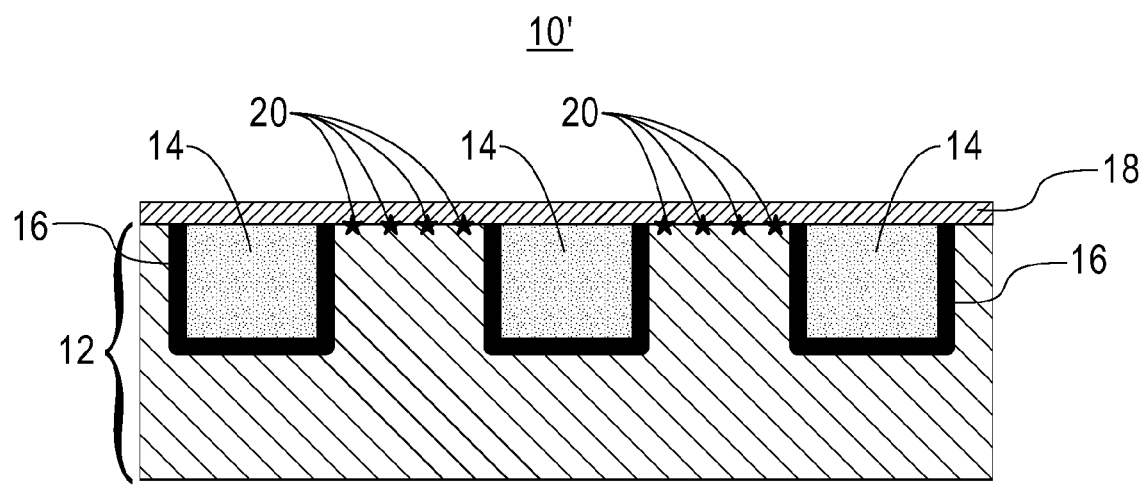
Figure 2A:
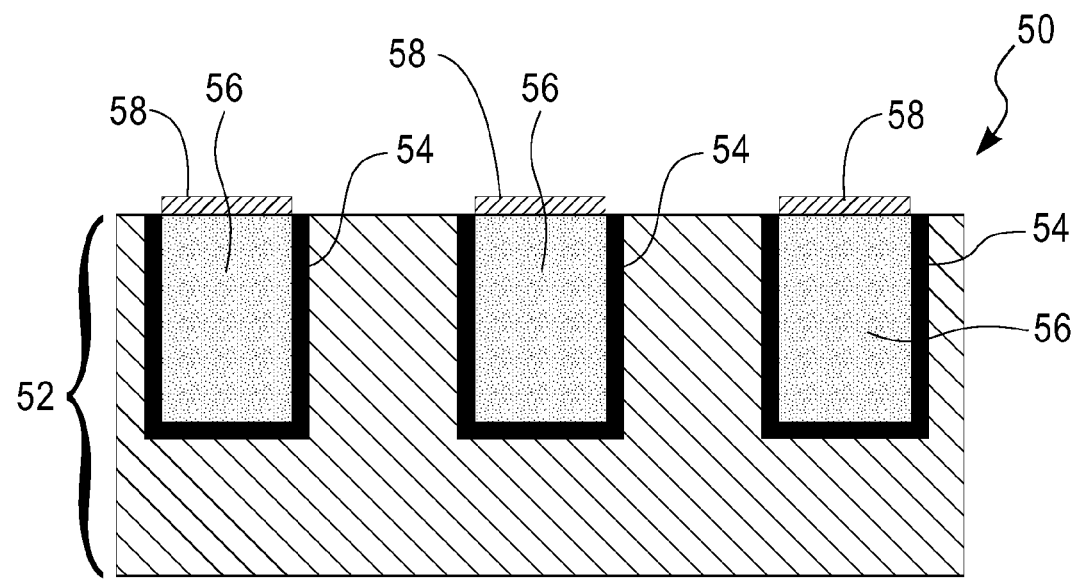
FIGS. 2A-2C are pictorial representations (through cross sectional views) depicting the basic processing steps that are employed in the present invention in fabricating a highly reliable and technology extendible interconnect structure having a high leakage resistance and substantially no metallic residues present at the surface of the dielectric material.
Figure 2B:
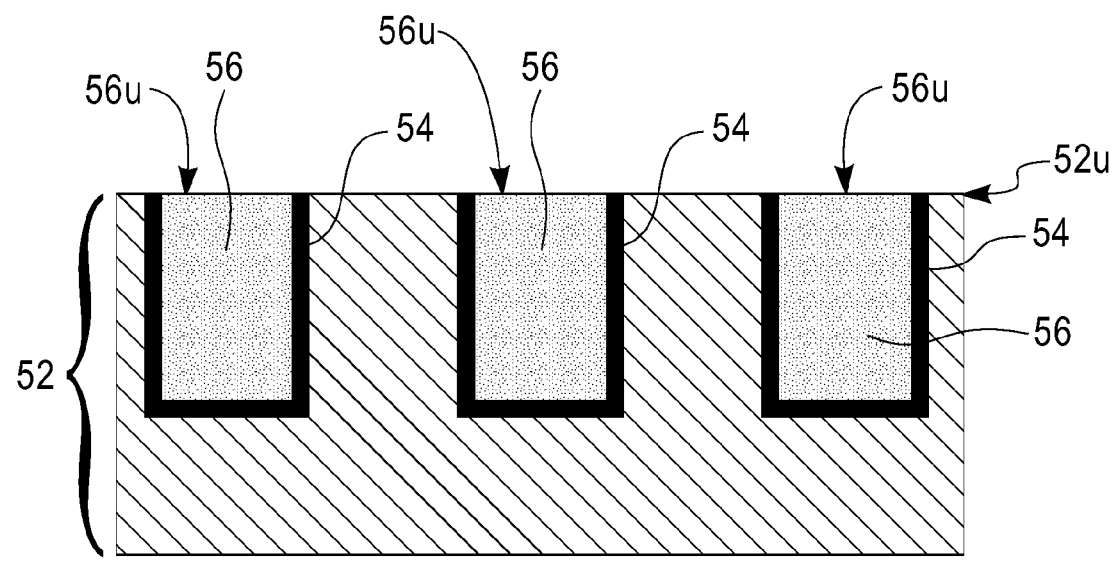
Figure 2C:
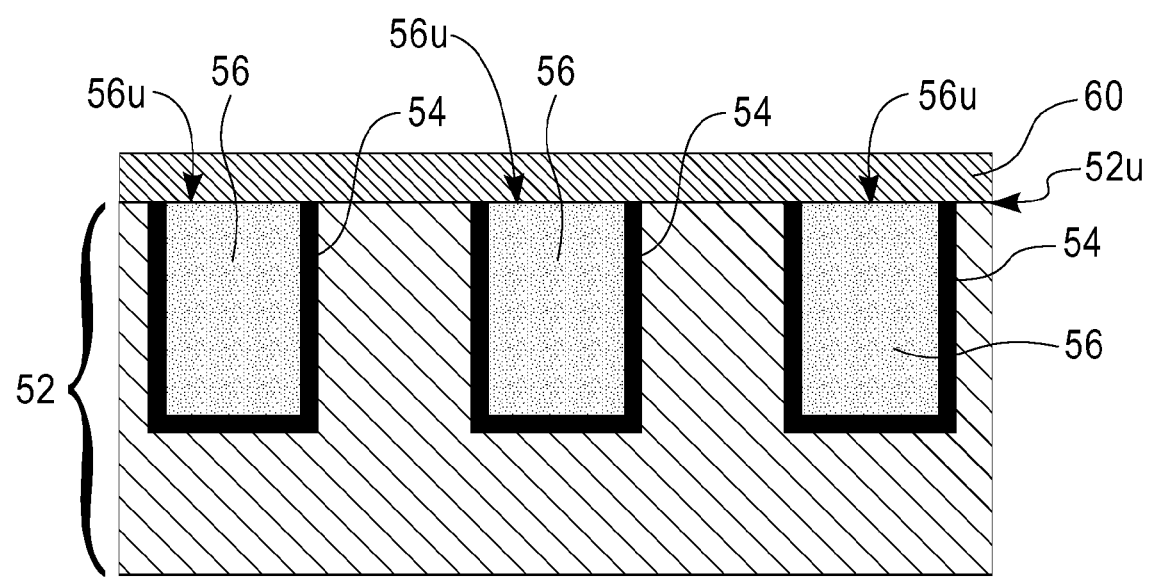

Reference is now made to FIGS. 2A-2C which illustrate the basic processing steps that are employed in forming the semiconductor interconnect structure of the present invention. As stated above, the inventive method includes a step of providing a structure including a dielectric material having a plurality of conductive features embedded therein. Each conductive feature within the dielectric material includes a surface oxide layer, and the dielectric material has an upper surface that contains metallic residues thereon. After providing the structure, the structure is subjected to a thermal and chemical-only pretreatment step (i.e., a pretreatment step which does not include a plasma) that removes the surface oxide and the metallic residues from the structure. Next, a dielectric capping layer is formed (in-situ or ex-situ) on the now bare upper surface of each of the plurality of conductive features and on the now bare upper surface of the dielectric material.

Specifically, and referring to FIG. 2A, there is illustrated an initial structure 50 of the invention that comprises a dielectric material 52 and a plurality of conductive features 56, each including a conductive material, embedded within the dielectric material 52. As shown, a diffusion barrier 54, in the shape of a "U", separates each of the conductive features 56 from the dielectric material 52. Also, as shown, the upper surfaces of the dielectric material 52, each conductive feature 56 and the diffusion barrier 54 are substantially coplanar with each other at this stage of the present invention. Also shown in FIG. 2A is the presence of a surface oxide layer 58 that inherently forms upon the upper surface of the conductive feature after the conductive feature has been formed by deposition and planarization. The surface oxide layer 58, which typically has a thickness from about 1 to about 20 Å, is undesirable since the presence of the surface oxide may serve to enhance the electromigration of conductive ions from the plurality of conductive features 56. The surface oxide layer 58 is inherently formed after planarization.

The dielectric material 52 of the initial structure 50 may be located upon a substrate (not shown in the drawings of the present application). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a first interconnect level of a multilayered interconnect structure.

The dielectric material 52 of the initial structure 50 comprises any interlevel or intralevel dielectric including inorganic dielectrics or organic dielectrics. The dielectric material 52 may be porous or non-porous. Some examples of suitable dielectrics that can be used as the dielectric material 52 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material 52 may vary depending upon the dielectric material used as well as the exact number of dielectrics layers within the dielectric material 52. Typically, and for normal interconnect structures, the dielectric material 52 has a thickness from about 50 to about 1000 nm.

The dielectric material 52 is deposited on the surface of the substrate (not shown) utilizing any conventional deposition process including, but not limited to chemical vapor deposition (CVD), plasma enhanced chemical vapor deposition (PECVD), spin-on coating, evaporation, and chemical solution deposition.

After forming the dielectric material 52, a plurality of openings (which will subsequently house the conductive features) are formed into the dielectric material 52 utilizing lithography and etching. The lithographic process includes forming a photoresist (not shown) atop the dielectric material 52, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), and/or a wet chemical etching process. Typically, reactive ion etching is used in providing the openings to the dielectric material 52.

The depth of each opening that is formed into the dielectric material 52 (measured from the upper surface of the dielectric material to the bottom wall of the opening) may vary and it is not critical to the present application. In some embodiments, each of the openings may extend entirely through the dielectric material. In yet other embodiments, each of the openings stops within the dielectric material 52 itself. In yet further embodiments, different depth openings can be formed.

It is further observed that each opening may be a via opening, a line opening, and/or a combined via/line opening. In FIG. 2A, and by way of an example, each of the openings is shown as line openings.

Next, a diffusion barrier 54 is formed on all exposed surfaces of the structure including atop the dielectric material 52 as well as within each of the openings (i.e., on sidewalls and the bottom wall of each of the openings). The diffusion barrier 54 comprises Ta, TaN, Ti, TiN, Ru, RuN, RuTa, RuTaN, W, WN or any other material that can serve as a barrier to prevent a conductive material from diffusing there through. The thickness of the diffusion barrier 54 may vary depending on the deposition process used as well as the material employed. Typically, the diffusion barrier 54 has a thickness from about 2 to about 50 nm, with a thickness from about 5 to about 20 nm being more typical.

The diffusion barrier 54 is formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

Conductive features 56 including a conductive material are then formed within each of the openings that are now lined with at least diffusion barrier 54. The conductive material of each of the conductive features 56 may comprise polySi, SiGe, a conductive metal, an alloy comprising at least one conductive metal, a conductive metal silicide or combinations thereof. Preferably, the conductive material of each of the conductive features 56 is a conductive metal such as Cu, W or Al, with Cu or a Cu alloy (such as AlCu) being highly preferred in the present invention.

Any conventional deposition process including chemical vapor deposition (CVD), plasma enhanced chemical vapor deposition (PECVD), sputtering, chemical solution deposition or plating that fills the at least one opening from the bottom upwards can be used to provide each conductive feature 56 of the initial structure 50. Preferably, a bottom-up plating process is employed.

Next, a planarization process including, for example, chemical mechanical polishing and/or grinding is then performed to form the initial structure shown in FIG. 2A. Typically, chemical mechanical polishing is employed. It is noted that metallic residues (not shown) are typically present on the exposed surface of the dielectric material 52 at this point of the inventive process.

After providing the initial structure 50 shown in FIG. 2A, the structure is subjected to a pretreatment step that removes the surface oxide 58 and metallic residue (not shown) from the structure. Unlike prior art methods, the inventive pretreatment step does not include the generation of a plasma. That is, no plasma pretreatment step is required in the invention to remove the surface oxide layer 58 from atop the conductive feature 56 as well as the metallic residues (not shown in FIG. 2A) from atop the dielectric material 52.

Instead of using a conventional plasma related surface pretreatment, the present invention utilizes a thermal and chemical-only pretreatment process to remove the surface oxide layer 58 from atop the conductive feature 56 as well as the metallic residues (not shown in FIG. 2A) from atop the dielectric material 52.

Specifically, the thermal and chemical-only pretreatment step utilized in the present invention is performed in a reducing ambient including, for example, a $H_2$-containing atmosphere, a $NH_3$-containing atmosphere, a $N_2$-containing atmosphere, a $NF_3$-containing atmosphere and mixtures. Again it is emphasized that the reducing ambients employed in the present invention are not formed into a plasma, but rather they remain as a chemical gas or vapor. In one preferred embodiment, the reducing ambient is preferably a $NH_3$-containing atmosphere.

The thermal and chemical-only pretreatment step of the present invention is performed at an elevated temperature that is typically within a range from about 100° to about 500° C., with a temperature from about 150° to about 450° C. being even more typical. The duration of the thermal and chemical-only pretreatment process may vary depending on the type of conductive material present within the surface oxide and metallic residues. Typically, the duration of the thermal and chemical-only pretreatment is from about 1 to about 20 minutes, with a duration from about 2 to about 5 minutes being even more typical.

Not only does the thermal and chemical-only pretreatment step of the present invention remove the surface oxide layer 58 from atop the conductive feature 56 as well as the metallic residues (not shown in FIG. 2A) from atop the dielectric material 52, but applicants have determined that the thermal and chemical-only pretreatment step of the present invention does not cause any increase in leakage current between the conductive features after the inventive pretreatment step. As observed in the background section of the instant application, prior art plasma pretreatment processing resulted in a certain level of physical damage on the exposed dielectric surface and exhibited increased leakage current after performing the pretreatment step.

It is observed that the inventive thermal and chemical-only pretreatment step may occur ex-situ to the tool used to deposit the dielectric capping layer, or it can be performed in-situ in the same tool. In a preferred embodiment of this invention, the thermal and chemical-only pretreatment step is performed in-situ in the same tool used to deposit the dielectric capping layer 60. It is further observed that the thermal and chemical-only pretreatment step provides a structure, see FIG. 2B, in which each conductive feature 56 has an upper surface 56u that is devoid of a surface oxide, and the dielectric material 52 has an upper surface 52u that is devoid of metallic residues and free of physical damage.

FIG. 2C illustrates the structure of FIG. 2B after forming a dielectric capping layer 60 on the exposed surfaces of the structure. The dielectric capping layer 60 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. Any conventional deposition process such as, for example, chemical vapor deposition, plasma enhanced chemical vapor deposition, chemical solution deposition, evaporation, and atomic layer deposition may be used in forming the dielectric capping layer 60. The thickness of the dielectric capping layer 60 may vary depending on the technique used to form the same as well as the material make-up of the layer. Typically, the dielectric capping layer 60 has a thickness from about 15 to about 100 nm, with a thickness from about 25 to about 45 nm being more typical.

Specifically, FIG. 2C illustrates the resultant interconnect structure of the invention that includes a dielectric material 52 having a plurality of conductive features 56 embedded therein. Each conductive feature 56 has an upper surface 56u that is devoid of a surface oxide, and the dielectric material 52 has an upper surface 52u that is devoid of metallic residues and is free of physical damage. A dielectric capping layer 60 is located atop each of the conductive features 56 and the dielectric material 52. The dielectric capping layer 60 has an interface with each of the conductive features 56 that is substantially defect-free. Also, the dielectric capping layer has an interface with the dielectric material that is substantially defect-free. Moreover, the upper surface 52u of the dielectric material 52 is free of physical damage.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating an interconnect structure comprising:
providing a structure including a dielectric material having a plurality of conductive features embedded therein, each of said plurality of conductive features includes a surface oxide layer, and said dielectric material having an upper surface that contains metallic residues thereon;
subjecting said structure to a thermal and chemical-only pretreatment step which removes said surface oxide layer and said metallic residues from said structure, said thermal and chemical only pretreatment step comprises heating the structure in a reducing ambient including a $H_2$-containing atmosphere, a $NF_3$-containing atmosphere or a mixture thereof, without the presence or generation of any plasma; and forming a dielectric capping layer on a bare upper surface of each of said plurality of conductive features and on a bare upper surface of said dielectric material.

2. The method of claim 1 wherein said reducing ambient is said $H_2$-containing atmosphere.

3. The method of claim 1 wherein said reducing ambient is said $NF_3$-containing atmosphere.

4. The method of claim 1 wherein said thermal and chemical-only pretreatment step is performed at an elevated temperature that is within a range from about 100° to about 500° C.

5. The method of claim 4 wherein said temperature is in a range from about 150° to about 450° C.

6. The method of claim 1 wherein said thermal and chemical-only pretreatment step is performed for a period of time from about 1 to about 20 minutes.

7. The method of claim 6 wherein said period of time is from about 2 to about 5 minutes.

8. The method of claim 1 wherein said structure further includes a U-shaped diffusion barrier separating each of said plurality of conductive features from said dielectric material.

9. The method of claim 1 wherein said forming the dielectric capping layer is performed in a same tool as that of said thermal and chemical-only pretreatment step.

10. The method of claim 1 wherein said forming the dielectric capping layer is performed in a different tool as that of said thermal and chemical-only pretreatment step.

11. The method of claim 1 wherein each of said plurality of conductive features comprises Cu or a Cu-containing alloy.

12. A method of fabricating an interconnect structure comprising:

providing a structure including a dielectric material having a plurality of Cu-containing conductive features embedded therein, each of said Cu-containing conductive features includes a surface oxide layer, and said dielectric material having an upper surface that contains metallic residues thereon;

subjecting said structure to a thermal and chemical-only pretreatment step which removes said surface oxide layer and said metallic residues from said structure, said thermal-only pretreatment step comprises heating the structure at a temperature from about 100° to about 500° C. in a $H_2$-containing or $NF_3$-containing reducing ambient, without the presence or generation of any plasma; and forming a dielectric capping layer in a same tool as said thermal-only pretreatment step on a bare upper surface of each of said plurality of conductive features and on a bare upper surface of said dielectric material.

13. A method of fabricating an interconnect structure comprising:

providing a structure including a dielectric material having a plurality of conductive features embedded therein, each of said plurality of conductive features includes a surface oxide layer, and said dielectric material having an upper surface that contains metallic residues thereon;

subjecting said structure to a thermal and chemical-only pretreatment step, without the presence or generation of any plasma, which removes said surface oxide layer and said metallic residues from said structure, said thermal and chemical only pretreatment step comprises heating the structure in a reducing ambient of a $H_2$ and $N_2$ atmosphere, or a $H_2$ and $NH_3$ atmosphere; and forming a dielectric capping layer on a bare upper surface of each of said plurality of conductive features and on a bare upper surface of said dielectric material.

* * * * *